(12) United States Patent
Frank et al.

(10) Patent No.: US 8,058,933 B2
(45) Date of Patent: Nov. 15, 2011

(54) LOW FREQUENCY CLOCK GENERATION

(75) Inventors: Michael Louis Frank, Menlo Park, CA (US); Mark A. Unkrich, Redwood City, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 911 days.

(21) Appl. No.: 11/232,581

(22) Filed: Sep. 21, 2005

(65) Prior Publication Data

US 2007/0063775 A1    Mar. 22, 2007

(51) Int. Cl.
*H03B 27/00*    (2006.01)

(52) U.S. Cl. ............... 331/46; 331/2; 331/53; 331/42; 331/108 C

(58) Field of Classification Search ............ 331/108 C, 331/46, 37, 42, 2, 53
See application file for complete search history.

(56) References Cited

U.S. PATENT DOCUMENTS

| | | | |
|---|---|---|---|
| 3,249,888 A | 5/1966 | Hoffmann | |
| 3,421,106 A | 1/1969 | Garber et al. | |
| 4,916,411 A * | 4/1990 | Lymer | 331/25 |
| 6,404,293 B1 * | 6/2002 | Darabi et al. | 331/37 |
| 6,407,456 B1 * | 6/2002 | Ball | 257/777 |
| 6,459,341 B1 | 10/2002 | Oga | |
| 7,109,637 B2 * | 9/2006 | Komuro et al. | 310/320 |
| 7,212,075 B2 * | 5/2007 | Young et al. | 331/176 |
| 2003/0052743 A1 | 3/2003 | Piazza | |

FOREIGN PATENT DOCUMENTS

| | | |
|---|---|---|
| JP | 6-276020 | 9/1994 |
| JP | 8-70218 | 3/1996 |
| JP | 8-70232 | 3/1996 |

OTHER PUBLICATIONS

Patent Application in Great Britian No. 06090260.0 Search Report dated Jul. 21, 2006.

* cited by examiner

*Primary Examiner* — Arnold Kinkead

(57) ABSTRACT

A first and a second resonator are fabricated monolithically adjacent to one another. The first resonator is the reference resonator. The resonant frequency of the second resonator is offset by a difference frequency Fo from the first resonator. Each resonator is included within an oscillator. A mixer receives the output of both oscillators. A low pass filter receives the mixer output and generates a clock signal whose frequency is equal to the difference frequency Fo.

17 Claims, 2 Drawing Sheets

LOW FREQUENCY CLOCK GENERATION

BACKGROUND

Several methods exist to generate low frequency system reference clocks. Currently the most common uses a crystal-based oscillator utilizing quartz for the crystal element. Crystal oscillators can be temperature compensated. The fundamental resonant frequency of the crystal typically ranges from below 10 MHz up to perhaps 70 MHz. This tone is then used in a phase lock loop to control a higher frequency voltage controlled oscillator that generates the desired frequency of operation of the system. The temperature controlled crystal oscillator typically costs between $0.30 and $1.00 depending upon performance requirements and is considered a commodity in many markets with manufacturers competing primarily on price.

In addition to the cost impact, a crystal oscillator is slow to start, as the crystal itself must go through many periods before there is sufficient energy to support the oscillation. This start up time is inefficient as the radio cannot function until it is done.

SUMMARY

The invention provides an energy efficient, small, and inexpensive clock for use in integrated circuit designs. In a preferred embodiment, a first and a second resonator are fabricated monolithically adjacent to one another. The first resonator is the reference resonator. The resonant frequency of the second resonator is offset by a difference frequency Fo from the first resonator. Each resonator is included within an oscillator. A mixer receives the output of both oscillators. A low pass filter receives the mixer output and generates a clock signal whose frequency is equal to the difference frequency Fo.

DETAILED DESCRIPTION

Figure 1:
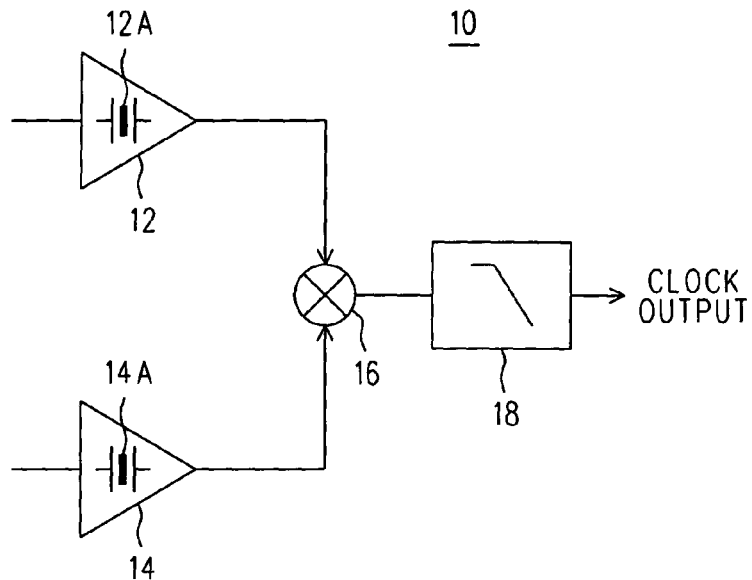
FIG. 1 is an embodiment of the present invention.

FIG. 1 is an embodiment 10 of the present invention. A first and a second resonator 12A, 14A, are fabricated monolithically adjacent to one another. The first resonator 12A is the reference resonator. The resonant frequency of the second resonator 14A is offset by a difference frequency Fo from the first resonator 12A. Each resonator 12A, 14A is included within an oscillator 12, 14, respectively. A mixer 16 receives the output of both oscillators 12, 14. A low pass filter 18 receives the mixer output and generates a clock signal whose frequency is equal to the difference frequency, Fo. In principle, this offset frequency can range from DC to many GHz. A practical frequency offset includes the typical range of crystal oscillators and may be considerably extended in range at high frequencies. Thus, this scheme could easily generate a frequency between 10 and 500 MHz.

The oscillation frequencies are determined by the resonant frequency of the respective resonator. The mixer output signal includes a high frequency component in the range of the resonant frequencies and low frequency component having a frequency proportional to the difference frequency Fo of the two oscillators. The low frequency component may be extracted using a low pass filter to generate the desired lower frequency clock signal.

The resonators may be Film Bulk Acoustic Resonators (FBARs). The FBAR can be built on a semiconductor substrate, such as silicon. Similarly, the rest of the oscillator circuit, excluding the FBAR, is built on a semiconductor substrate using CMOS, Bipolar, or BiCMOS processes. This allows for a variety of manufacturing packaging and integration strategies to create a clock generation circuit. The resonator may be directly attached to the rest of the oscillator during the packaging process by flip-chip interconnect of the FBAR device or die stacking and wire bonding the devices together, for example. Alternatively, by combining the semiconductor processing, the FBAR device may be integrated directly with the oscillator circuit on the same substrate. Alternately, the FBAR device may be adjacent to the oscillator circuit together on a separate substrate, with electrical connections provided by flip-chip interconnect or wire bonding and electrically connected to the substrate through wire bonding. The resonators can be fabricated to have tracking different coefficients of temperature drift. In a preferred embodiment, the temperature coefficients are designed so that the difference frequency is constant with temperature.

The oscillatorclock generation circuit may be attached to a substrate as a separate die, e.g. to using as an illustrative example flip-chipping or die stacking technology. In this embodiment, a die that includes the oscillatorclock generation circuit is attached by either flipping the oscillator component onto a transceiver integrated circuit (IC) and also connecting the I/O pads or attaching it face up and using bond wires to make the connections. Alternatively, the oscillatorclock generation circuit may be fabricated on the same substrate as an integrated circuit.

Figure 2:
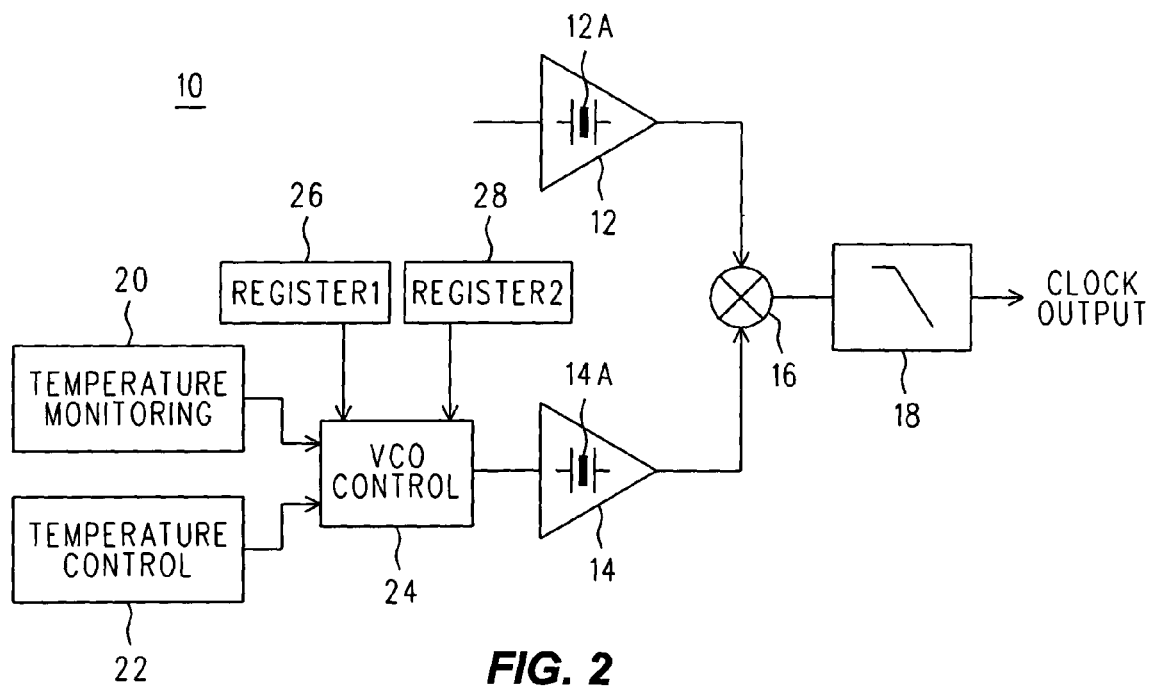
FIG. 2 is an embodiment of the present invention.

FIG. 2 illustrates an alternate embodiment, programmability of the output frequency is included while improving the accuracy and temperature characteristics of the oscillator. A temperature monitoring circuit 20 and a temperature control circuit 22 provide inputs to a VCO control circuit 24. A first register 26 stores a selected oscillator frequency offset setting. A second register 28 stores a temperature compensation setting. The VCO control circuit 24 receives the values from the first and the second registers 26, 28.

The second oscillator 14 is a voltage controlled oscillator (VCO) or digitally controlled oscillator that allows the frequency of the oscillation to be modified by changing a control voltage or digital control value. A corresponding change in the output clock frequency occurs with a change in the frequency of the second oscillator 14 since the output clock frequency is equal to the difference between the difference of the two oscillators.

When a specific output clock frequency in manufacturing is desired, it may be set by measuring the output clock frequency for various control values, e.g. voltage or digital. In the next step, the desired output frequency is programmed and may be stored in a register.

With inclusion of a temperature monitoring and control circuits 20, 22 on the substrate, the effects of temperature may be cancelled out. Sensing temperature using diodes or other semiconductor devices built into the substrate is well known. The sensed temperature of the substrate provides a control values to the temperature control circuit. Typically, this responds in a linear manner to a linear change in control value but may be non-linear depending upon the requirements of the system if the temperature monitor is non-linear or the VCO control is non-linear. By measuring the output clock frequency at a second temperature, a second register, may be programmed and adjusted until the output frequency matches the desired frequency.

This second register provides temperature compensation of the output clock frequency.

Figure 3:
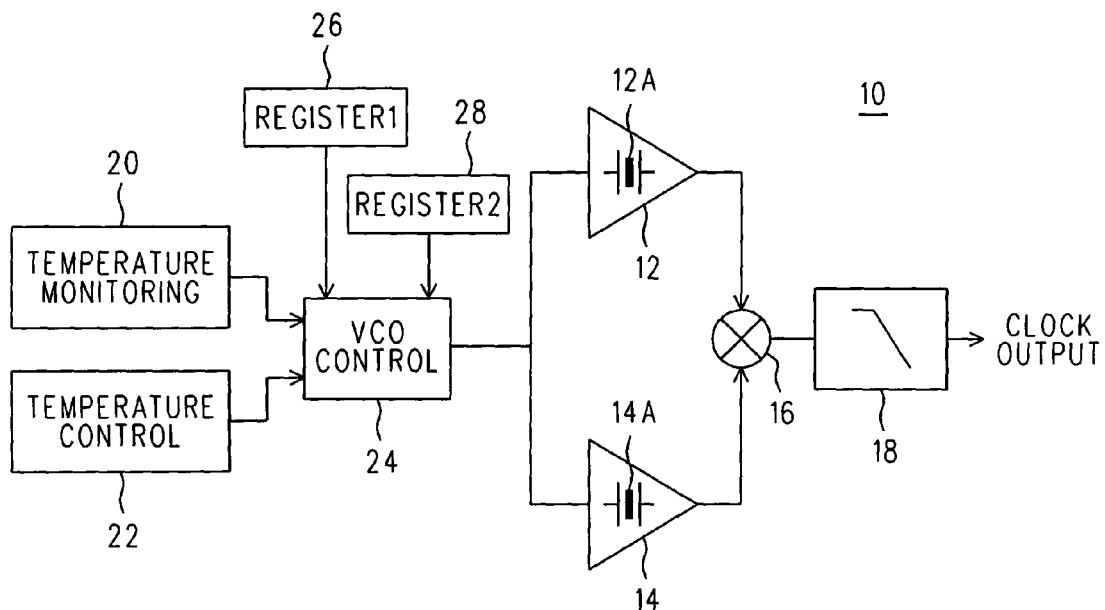
FIG. 3 is an embodiment of the present invention.

FIG. 3 illustrates an alternate embodiment. The first and second oscillators 12, 14 may both be VCOs receiving the output of the VCO control circuit 24. This provides symmetric design of the oscillators used to generate the difference frequency for the output clock frequency. By matching the design of the VCOs, the frequency changes due to process variations will track. To maintain the matching of the biasing of the VCOS VCOs requires symmetric application of the control for to both of them.

To illustrate, if the first oscillator 12 can adjust between frequency F1A and F1B, where F1A<F1B, and the second oscillator 14 can adjust between frequency F2A and F2B, where F2A<F2B and F1A<F1B<F2A<F2B, then for one extreme of the control value, the first oscillator 12 would operate at frequency F1A and the second oscillator 14 would operate at frequency F2B yielding the maximum value for the difference frequency F2B-F1A at the output. At the other extreme of the control value, the first oscillator 12 would operate at frequency F1B and the second oscillator 14 would operate at frequency F2A yielding the minimum value of the difference frequency F2A-F1B at the output. Symmetric design would match the amount of change in the first oscillator 12 with that of the second oscillator 14 in a continuous manner.

Figure 4:
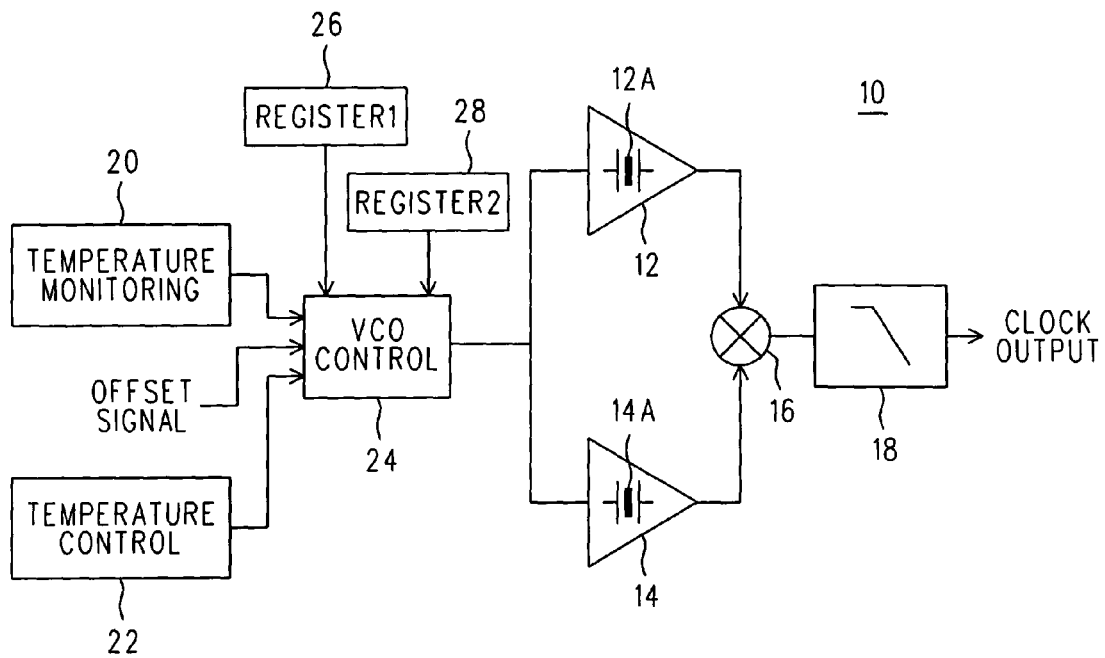
FIG. 4 is an alternative embodiment of the present invention.

FIG. 4 is an alternate embodiment. An input signal is added to the VCO control circuit 24. The input signal may be a modulation source whereby the data represented at the signal Vin will modulate the carrier frequency, e.g. a simple form of Frequency Shift Keying (FSK). At the output, the output clock is now the carrier frequency with a modulated FSK signal on top of the carrier.

The invention claimed is:

1. A clock generation circuit comprising:
   a first oscillator including a resonator having a first resonant frequency, having an oscillator output;
   a second oscillator including a resonator having a second resonant frequency, having an oscillator output;
   wherein the first and second resonant frequencies are separated by a difference frequency;
   a mixer, receiving each of the oscillator outputs, generating a mixer output signal;
   a low pass filter, receiving the mixer output signal, generation a clock signal that is proportional to the difference frequency;
   a first register storing a preferred oscillator setting; and
   a second register storing a temperature compensation setting;
   one of the first and the second oscillators being adjustable by the preferred oscillator setting, and
   the one of the first and the second oscillators being adjustable by the temperature compensation setting.

2. A clock generation circuit, as defined in claim 1, wherein the resonators are selected from a group that includes film bulk acoustic resonators.

3. A clock generation circuit, as defined in claim 1, further comprising a substrate that integrates the first and second oscillators, mixer, and low pass filter.

4. A clock generation circuit, as defined in claim 1, wherein the resonators are selected from a group that includes film bulk acoustic resonators.

5. A clock generation circuit, as defined in claim 1, wherein the other of the first and the second oscillators is adjustable by at least one of the preferred oscillator setting and the temperature compensation setting.

6. A clock generation circuit, as defined in claim 5, wherein one of the first and the second oscillators is adjustable by a modulation source.

7. A device comprising:
   a substrate; and
   a clock generation circuit, positioned proximate to the substrate, including,
      a first oscillator including a resonator having a first resonant frequency, having an oscillator output,
      a second oscillator including a resonator having a second resonant frequency, having an oscillator output,
      wherein the first and second resonant frequencies are separated by a difference frequency,
      a mixer, receiving each of the oscillator outputs, generating a mixer output signal,
      a low pass filter, receiving the mixer output signal, generation a clock signal that is proportional to the difference frequency;
      a first register storing a preferred oscillator setting; and
      a second register storing a temperature compensation setting,
      one of the first and the second oscillators being adjustable by the preferred oscillator setting, and
      the one of the first and the second oscillators being adjustable by the temperature compensation setting.

8. A device, as in claim 7, wherein the clock generation circuit is monolithically integrated in the substrate.

9. A device, as in claim 7, wherein the clock generation circuit is attached to the substrate using flip chip technology.

10. A device, as in claim 7, wherein the clock generation circuit is attached to the substrate using die stacking technology.

11. A device, as in claim 7, wherein the clock generation circuit is adjacent to the substrate using a common leadframe.

12. A device, as defined in claim 7, wherein the other of the first and the second oscillators is adjustable by at least one of the preferred oscillator setting and the temperature compensation setting.

13. A device, as defined in claim 12, wherein one of the first and the second oscillators is adjustable by a modulation source.

14. A clock generation circuit comprising:
   a first oscillator including a resonator having a first resonant frequency, having an oscillator output;
   a second oscillator including a resonator having a second resonant frequency, having an oscillator output;
   wherein the first and second resonant frequencies are separated by a difference frequency;
   a mixer, receiving each of the oscillator outputs, generating a mixer output signal;
   a low pass filter, receiving the mixer output signal, generating a clock signal that is proportional to the difference frequency;
   a first register storing a preferred oscillator setting; and
   one of the first and the second oscillators being adjustable by the preferred oscillator setting,
   wherein the preferred oscillator setting comprises a selected oscillator frequency offset setting.

15. A clock generation circuit comprising:
   a first oscillator including a resonator having a first resonant frequency, having an oscillator output;
   a second oscillator including a resonator having a second resonant frequency, having an oscillator output;

wherein the first and second resonant frequencies are separated by a difference frequency;
a mixer, receiving each of the oscillator outputs, generation a mixer output signal;
a low pass filter, receiving the mixer output signal, generating a clock signal that is proportional to the difference frequency;
a first register storing a preferred oscillator setting; and
one of the first and the second oscillators being adjustable by the preferred oscillator setting,
wherein at least one of the first and second oscillators is a voltage controlled oscillator (VCO) and wherein at least one of the first and second resonant frequencies is adjustable by the preferred oscillator setting to cause the difference frequency to be a selected value.

16. A device comprising:
a substrate; and
a clock generation circuit, positioned proximate to the substrate, including,
    a first oscillator including a resonator having a first resonant frequency, having and oscillator output,
    a second oscillator including a resonator having a second resonant frequency, having an oscillator output,
    wherein the first and second resonant frequencies are separated by a difference frequency,
    a mixer, receiving each of the oscillator outputs, generation a mixer output signal,
    a low pass filter, receiving the mixer output signal, generation a clock signal that is proportional to the difference frequency;
    a first register storing a preferred oscillator setting; and
    one of the first and the second oscillators being adjustable by the preferred oscillator setting,
    wherein the preferred oscillator setting comprises a selected oscillator frequency offset setting.

17. A device comprising:
a substrate; and
a clock generation circuit, positioned proximate to the substrate, including,
    a first oscillator including a resonator having a first resonant frequency, having an oscillator output,
    a second oscillator including a resonator having a second resonant frequency, having an oscillator output,
    wherein the first and second resonant frequencies are seperated by a difference frequency,
    a mixer, receiving each of the oscillator outputs, generating a mixer output signal,
    a low pass filter, receiving the mixer output signal, generating a clock signal that is proportional to the difference frequency;
    a first register storing a preferred oscillator setting; and
    one of the first and the second oscillators being adjustable by the preferred oscillator setting,
    wherein at least one of the first and second oscillators is a voltage controlled oscillator (VCO) and wherein at least one of the first and second resonant frequencies is adjustable by the preferred oscillator setting to cause the difference frequency to be a selected value.

\* \* \* \* \*